United States Patent
Shin

(10) Patent No.: US 6,849,503 B1
(45) Date of Patent: Feb. 1, 2005

(54) METHOD FOR FORMING METAL INTERCONNECTIONS FOR FLASH MEMORY DEVICE

(75) Inventor: Hyeon Sang Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/744,426

(22) Filed: Dec. 22, 2003

(30) Foreign Application Priority Data

Nov. 12, 2003 (KR) .................................. 10-2003-0079891

(51) Int. Cl.$^7$ ......................................... H01L 21/336
(52) U.S. Cl. ................................................. 438/257
(58) Field of Search ........................ 438/257, 259, 438/128, 129, 598, 618

(56) References Cited

U.S. PATENT DOCUMENTS

2003/0089996 A1 * 5/2003 Hau-Riege .................. 257/774

* cited by examiner

Primary Examiner—Craig A. Thompson
(74) Attorney, Agent, or Firm—Ladas & Parry LLP

(57) ABSTRACT

To form metal interconnections in a flash memory device, the gate of the peripheral region is etched to form a first contact hole on a substrate. Silicon nitride and first oxide films are formed on the gate including the first contact hole. The first oxide film is etched to expose the source and filled by a first plug. A second oxide film is formed and etched with the first oxide films to form second contact holes exposing the drain, the source, and the first contact hole that are filled by second plugs. A third oxide film is formed and etched to form third contact holes exposing the first and second plugs and a portion of the second oxide film corresponding to the drain. The second and first oxide films are etched to form fourth contact holes exposing the first and second plugs and the drain. Metal interconnections fills the fourth contact holes.

4 Claims, 6 Drawing Sheets

METHOD FOR FORMING METAL INTERCONNECTIONS FOR FLASH MEMORY DEVICE

BACKGROUND OF THE INVENTION

1. Field of the Invention

The present invention relates to a method for fabricating a flash memory device, and more particularly to a method for forming metal interconnections for a flash memory device, in which a damascene process is used such that the photoresist margin can be ensured and the capacitance between the metal interconnections can be reduced.

2. Description of the Prior Art

In a 0.115 µm flash memory device being currently developed, the linewidth and space between metal interconnections have very small values of 0.135 µm and 0.135 µm, respectively, and thus, a damascene process is generally used to form the metal interconnections. However, due to a small thickness of a photoresist film, the margin of etch selectivity becomes insufficient, so that the space between the metal interconnections (i.e., the thickness of an insulating film) will be significantly reduced to increase the capacitance between the metal interconnections, thereby causing RC delay at a serious level.

In an attempt to solve this problem, there is a developed method wherein dual damascene trenches are formed, and before depositing a tungsten metal film in the trench structure, a barrier film is deposited on the trench structure to prevent loss of the underlying oxide film during a subsequent wet cleaning step.

Hereinafter, the prior method for forming metal interconnections for a flash memory device will be described with reference to FIGS. 1A to 1C.

FIGS. 1A to 1C are cross-sectional views for illustrating a method for metal interconnections for a flash memory device according to the prior art.

As shown in FIG. 1A, a device isolation film (not shown) is formed on a P-type semiconductor substrate 1 having a cell region and a peripheral region by a shallow trench isolation (STI) process. Then, an ion implantation process is performed to form a N-well and a P-well in the substrate. Alternatively, the N-well and the P-well may be first formed before forming the device isolation film.

Then, PMOS and NMOS gates are formed on the substrate including the N- and P-wells while interposing a gate insulating film 2 therebetween. Each of the formed PMOS and NMOS gates consists of a floating gate 3, a dielectric film 4 and a control gate 5, which are sequentially deposited. The control gate 5 has a three-layered structure consisting of a polycrystalline silicon film, a tungsten silicide film and a silicon nitride film for hard masks.

Subsequently, insulating spacers 6 are formed at both sides of each of the gates. At this time, although not shown, a source and a drain are formed below both sides of each of the gates, respectively.

Next, the NMOS gate in the peripheral region is partially etched. Namely, the control gate 5 and the dielectric film 4 of the NMOS gate are partially etched to form a first contact hole (not shown) exposing the floating gate 3. Then, a silicon nitride film 7 is formed on the entire surface of the substrate including the first contact hole. The silicon nitride film 7 acts to prevent loss of a first oxide film during a subsequent wet cleaning step. Furthermore, the silicon nitride film 7 is formed in the form of a spacer in such a manner that it covers the inner surface of the first contact hole in the NMOS gate of the peripheral region.

Then, a first oxide film 9 is formed on the entire surface of the resulting substrate, and selectively etched to form a second contact hole 10 exposing the source of the cell region. In etching the first oxide film 9, the silicon nitride film 7 is used as an etch stopper.

Subsequently, a first polycrystalline silicon film (not shown) is deposited on the entire surface of the substrate including the second contact hole 10, and etched back to form a first plug 12 filling the second contact hole 10.

Then, a second oxide film 14 is formed on the entire surface including the first plug 12, and selectively etched to form a third contact hole 15 exposing the drain of the cell region. Thereafter, a second polycrystalline film (not shown) is deposited on the entire surface of the substrate including the third contact hole 15, and etched back to form a second plug 16 filling the third contact hole 15.

Next, as shown in FIG. 1B, a third oxide film 18 is formed on the substrate including the second plug 16, and selectively etched to form dual damascene trenches which expose the first and second plugs 12 and 13 of the cell region, and portions of the second oxide films corresponding to the source and drain of the peripheral region (i.e., the PMOS and NMOS active regions of the peripheral region) and to the first contact hole, respectively. Then, using the dual damascene trench structure of the third oxide film as a mask, the first oxide film and the first oxide film are etched to form fourth contact holes 19 which expose the first and second plugs 12 and 16 of the cell region, the source and drain of the peripheral region, and the first contact hole of the peripheral region, respectively.

Thereafter, as shown in FIG. 1C, a metal film (not shown) made of a material such as tungsten is deposited on the entire surface of the substrate including the fourth contact holes 19, and then subjected to chemical mechanical polishing (CMP) to form metal interconnections 22 filling the fourth contact holes 19. In FIG. 1C, the reference numeral 20 denotes a barrier film interposed between the fourth contact holes 19 and the metal interconnections 22.

FIG. 2 is a partial cross-sectional view of the peripheral region in FIG. 1b, which illustrates problems occurring in the prior method.

Referring to FIG. 2, when forming the barrier film according to the prior method, the silicon nitride film of a spacer form remains on the inner surface of the first contact hole in the NMOS gate of the peripheral region (see portion A in FIG. 2). Thus, the contact area to the control gate is reduced, resulting in an increase in contact resistance.

Meanwhile, in forming the metal interconnections, if the fourth contact holes for forming the metal interconnections are formed at the stepped portion of the third oxide film, the exposure margin will be insufficient, and also the photoresist margin will be insufficient since etching must be performed in such a manner as to expose the source and drain of the peripheral region. For this reason, the prior method has a problem in that contact patterns (fourth contact holes) are not properly formed such that the fourth contact holes are not properly opened.

SUMMARY OF THE INVENTION

Accordingly, the present invention has been made to solve the above-mentioned problems occurring in the prior art, and an object of the present invention is to provide a method for forming metal interconnections for a flash memory device, in which the plugs connected to the first contact hole in the NMOS gate of the peripheral region and to the source of the NMOS active region of the peripheral region are formed simultaneously with the plug connected to the drain of the cell region, so that the contact area between the control gate and the contact plug in the first contact hole can be ensured and also the photoresist margin in an etching step for forming the contact holes where the metal interconnections are formed can be ensured.

BRIEF DESCRIPTION OF THE DRAWINGS

To achieve the above objects, the present invention provides a method for forming metal interconnections for a flash memory device, which comprises the steps of: providing a semiconductor substrate having cell and peripheral regions defined therein; forming gates on the substrate; forming a source and a drain in the substrate at both sides of each of the gates; partially etching the gate of the peripheral region to form a first contact hole; successively forming a silicon nitride film and a first oxide film on the entire surface of the gate including the first contact hole; selectively etching the first oxide film using the silicon nitride film as an etch stopper, to form a second contact hole exposing the source of the cell region; forming a first plug filling the second contact hole; forming a second oxide film on the substrate including the first plug; selectively etching the second and first oxide films to form second contact holes which expose the drain of the cell region, the source of the peripheral region, and the first contact hole in the gate of the peripheral region, respectively; forming second plugs filling the second contact holes; forming a third oxide film on the substrate including the second plugs; selectively etching the third oxide film to form third contact holes of a dual damascene trench type, which expose the first plug, the second plugs, and a portion of the second oxide film corresponding to the drain of the peripheral region, respectively; etching the second and first oxide films using the third contact holes as a mask, to form fourth contact holes which expose the first plug, the second plugs and the drain of the peripheral region; and forming metal interconnections filling the fourth contact holes.

In the method of the present invention, a barrier film is preferably interposed between the fourth contact holes and the metal interconnections.

The barrier film is preferably made of a silicon nitride film.

The gates are preferably PMOS and NMOS gates each having a three-layered structure consisting of a floating gate, a dielectric film and a control gate.

BRIEF DESCRIPTION OF THE DRAWINGS

Figure 1A:
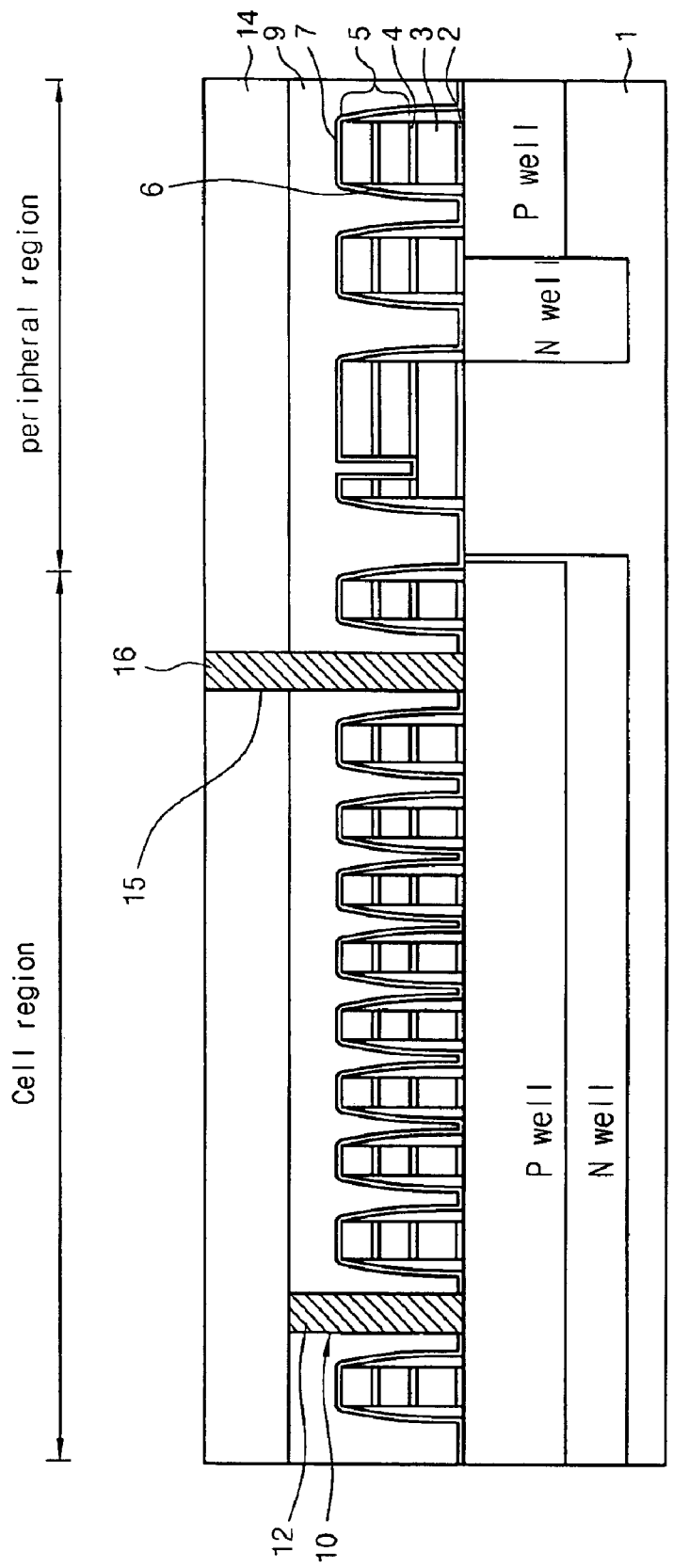
Figure 1B:
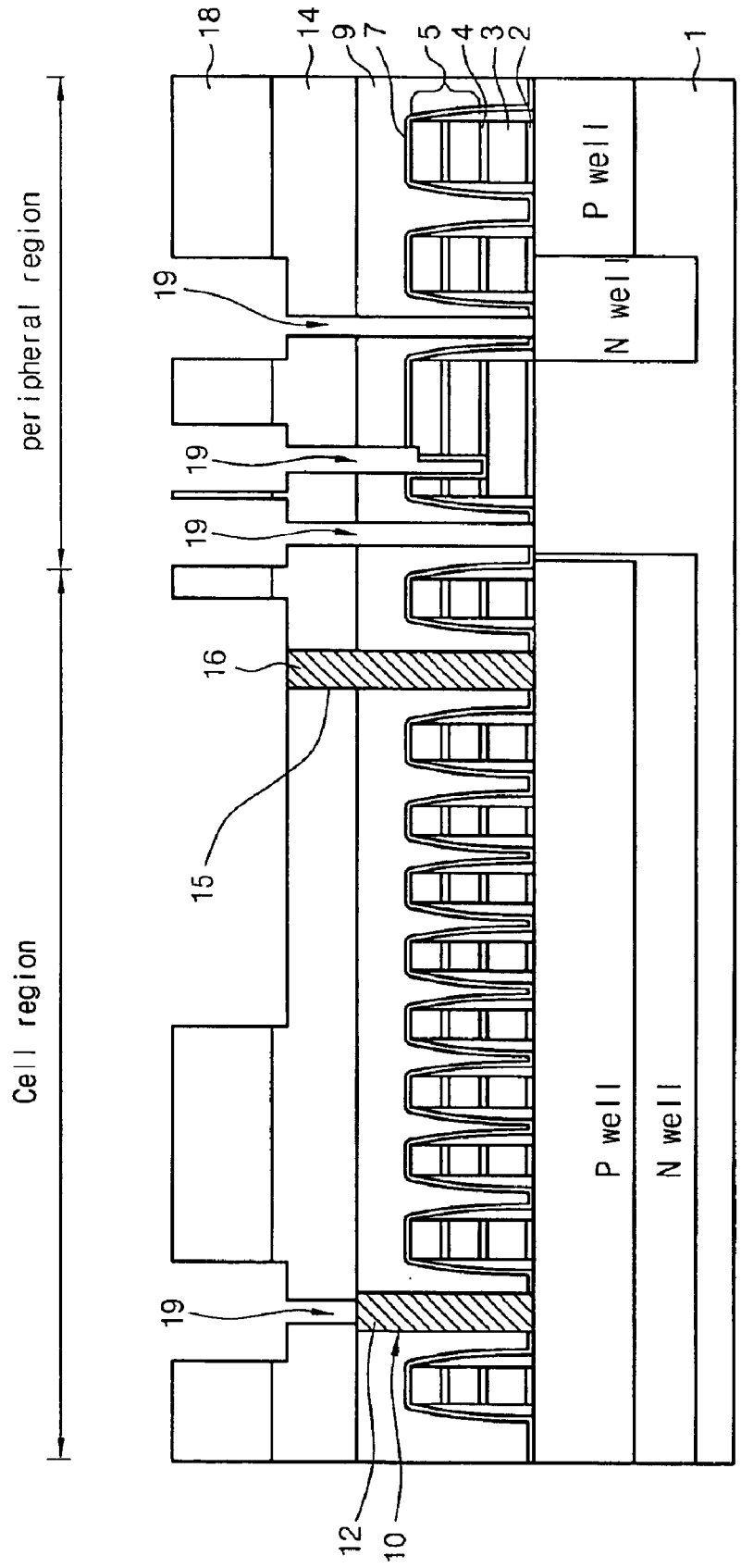
Figure 1C:
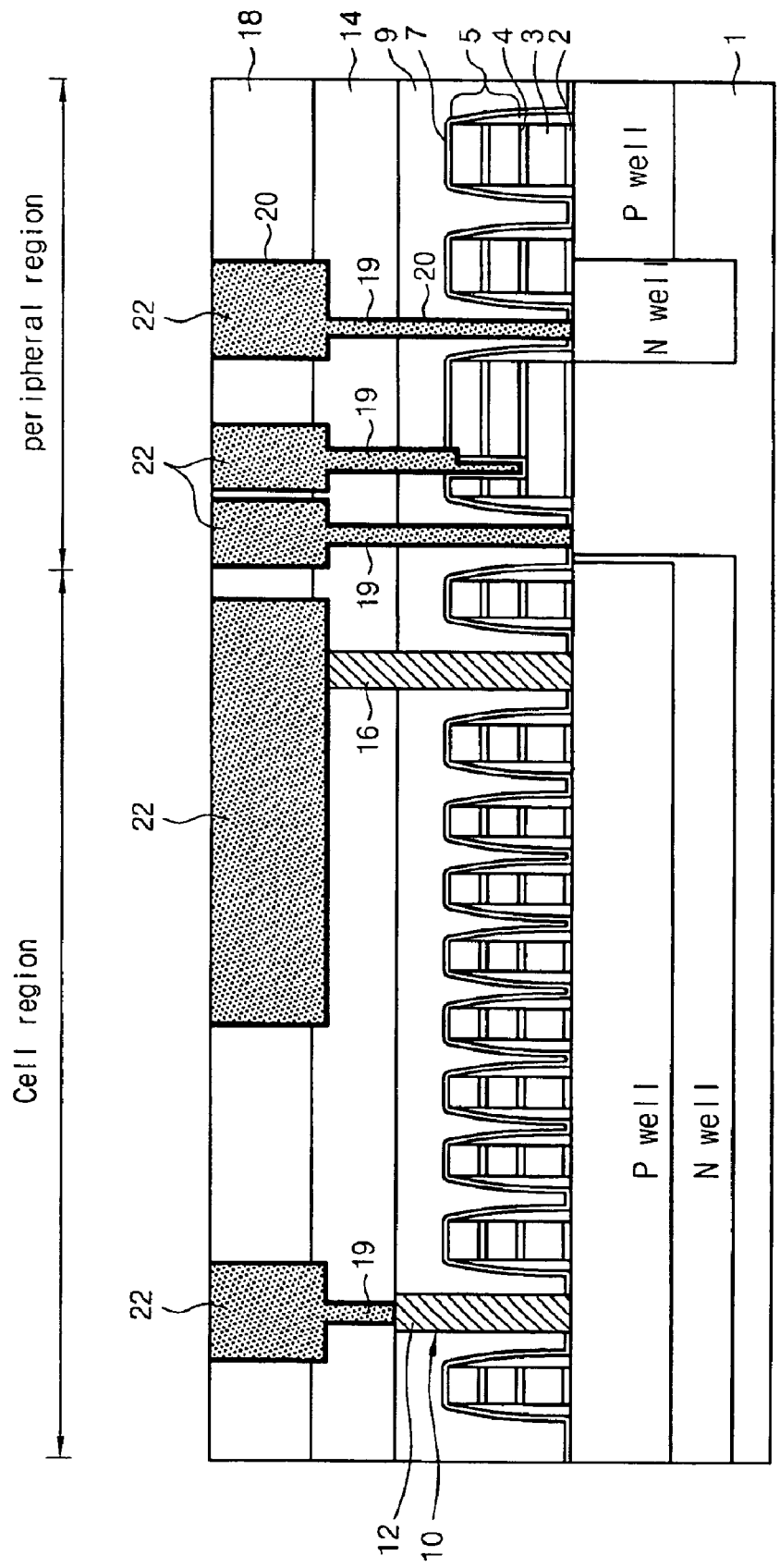
Figure 2:
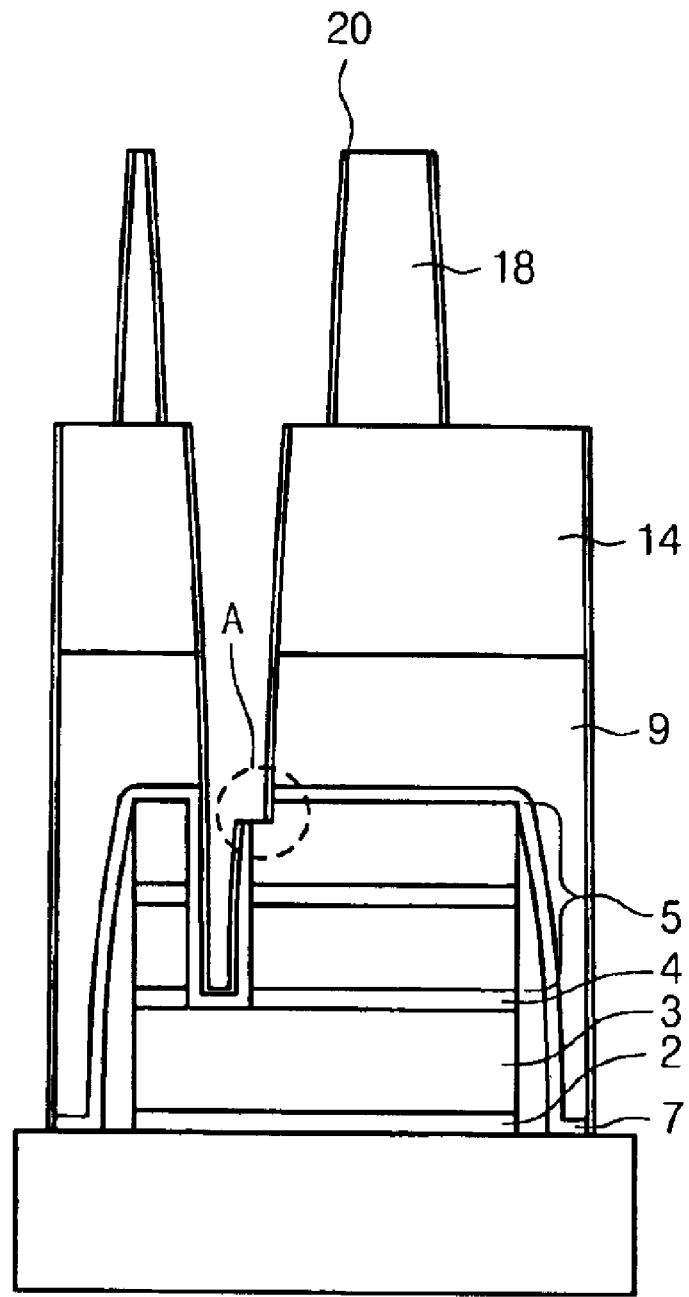
Figure 3A:
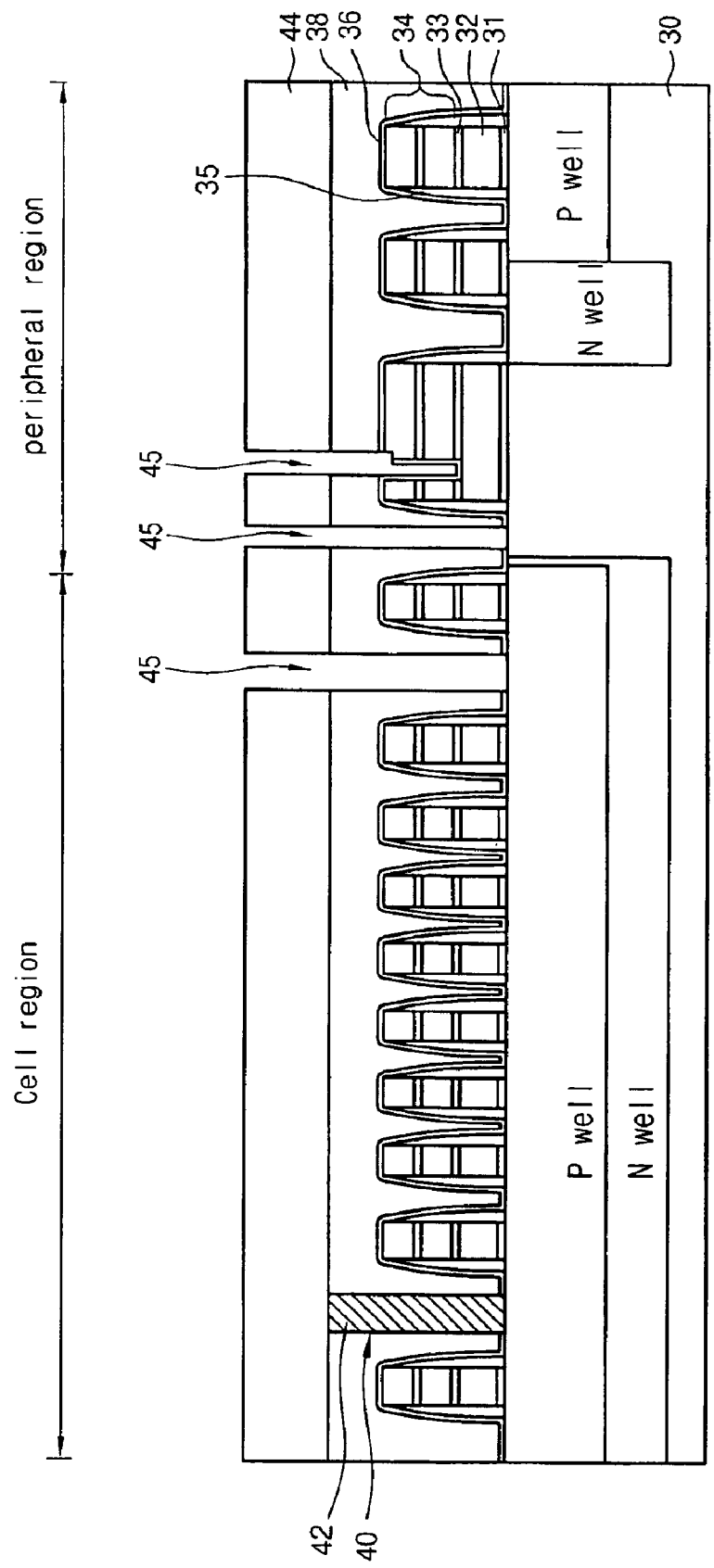
Figure 3B:
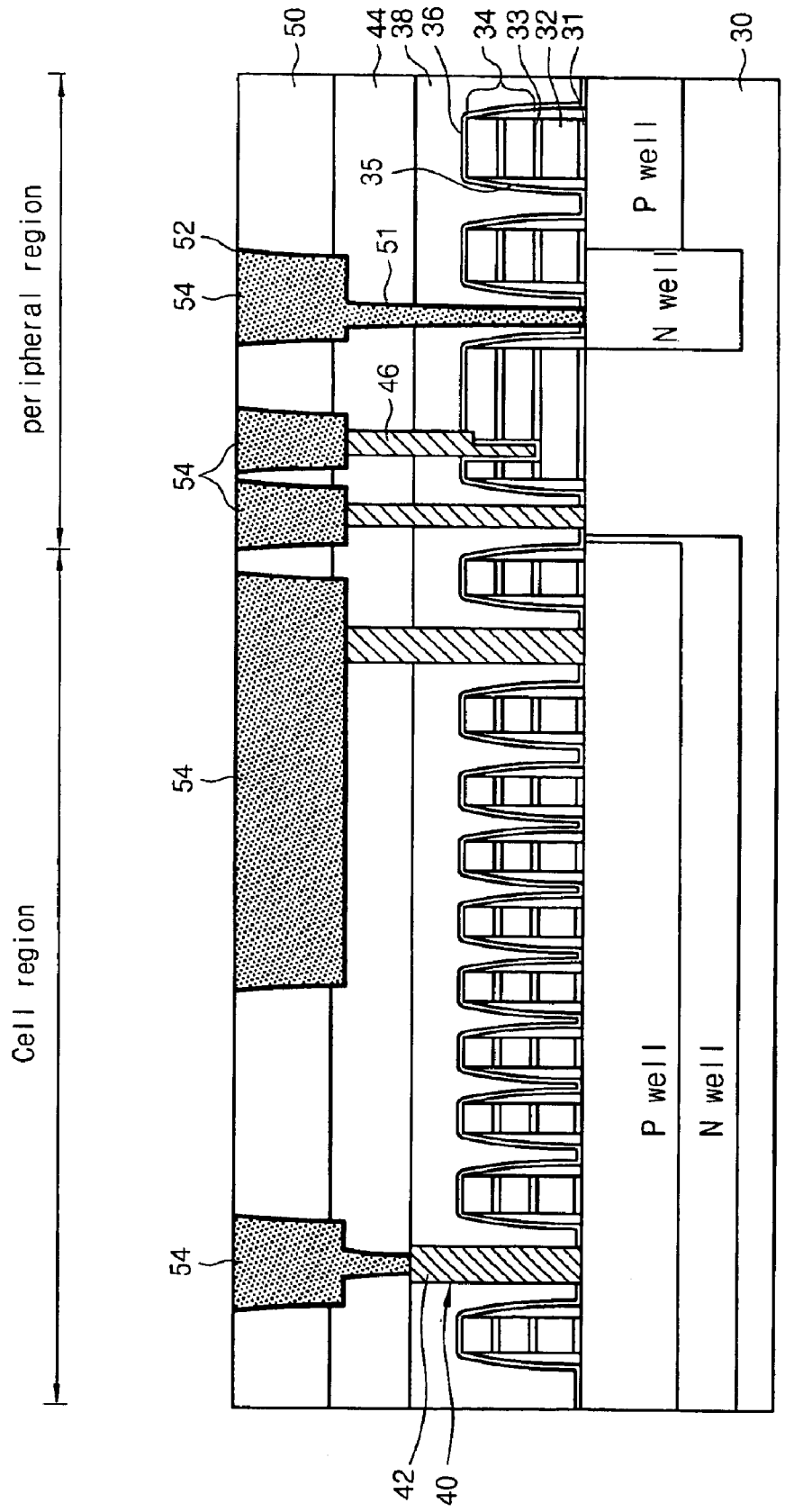

The above and other objects, features and advantages of the present invention will be more apparent from the following detailed description taken in conjunction with the accompanying drawings, in which:

FIGS. 1A to 1C are cross-sectional views for illustrating a method for forming metal interconnections for a flash memory device according to the prior art;

FIG. 2 is a partial cross-sectional view of the peripheral region in FIG. 1*b*, which illustrates problems occurring in the prior method; and FIGS. 3A and 3B are cross-sectional views for illustrating a method for forming metal interconnections for a flash memory device according to the present invention.

DETAILED DESCRIPTION OF THE PREFERRED EMBODIMENTS

Hereinafter, the present invention will be described in detail with reference to FIGS. 3A and 3B, which are cross-sectional views for illustrating a method for forming metal interconnections for a flash memory device according to the present invention.

As shown in FIG. 3A, a device isolation film (not shown) is formed in a P-type semiconductor substrate 30 having a cell region and a peripheral region by the conventional STI process, and then an ion implantation process is performed to form a N-well and P-well in the substrate. Alternatively, the N- and P-wells may be first formed before forming the device isolation film.

Then, PMOS and NMOS gates are formed on the substrate including the N- and P-wells while interposing a gate insulating film 31 therebetween. Each of the formed PMOS and NMOS gates consists of a floating gate 32, a dielectric layer 33 and a control gate 34, which are sequentially deposited. The floating gate has a three-layered structure consisting of a polycrystalline silicon film, a tungsten silicide film, and a silicon nitride film for hard masks.

Next, insulating spacers 35 are formed at both sides of each of the gates, and a source and a drain are formed below both sides of each of the gates by ion implantation. Thereafter, the NMOS gate of the peripheral region is partially etched. Namely, the control gate 34 and the dielectric film 33 of the NMOS gate are selectively etched to form a first contact hole (not shown) exposing the floating gate 32.

Then, a silicon nitride film 36 and a first oxide film 38 are successively formed on the entire surface of the substrate including the first contact hole. Next, the first oxide film 38 is selectively etched using the silicon nitride film 36 as an etch stopper, to form a second contact hole 40 exposing the source of the cell region. Thereafter, a first polycrystalline silicon film (not shown) is deposited on the entire surface of the substrate including the second contact hole 40, and then etched back to form a first plug 42 filling the second contact hole 40.

The steps as described above are conducted in the same manner as the prior art.

Next, a second oxide film 44 is deposited on the entire surface of the substrate including the first plug 42, and then, the second oxide film and the first oxide film are etched using a given mask, to form third contact holes 45 which expose the drain of the cell region, the NMOS source of the peripheral region, and the first contact hole, respectively.

Thereafter, as shown in FIG. 3B, a second polycrystalline silicon film (not shown) is deposited on the entire surface of the substrate, and etched back to form second plugs 46 filling the third contact holes 45.

Then, a third oxide film 50 is formed on the entire surface of the substrate including the second plugs 46, and partially etched to form dual damascene trenches which expose the first plug 42, the second plug 46, and a portion of the second oxide film corresponding to the PMOS drain of the peripheral region, respectively. Then, using the dual damascene trenches of the third oxide film as a mask, the second oxide film and/or the first oxide film is etched to form fourth contact holes 51 which expose the first plug 42, the second plug 46, and the PMOS drain of the peripheral region, respectively.

Next, a barrier film (not shown) and a tungsten metal film (not shown) are sequentially deposited on the resulting substrate, and then subjected to chemical mechanical polishing, to form metal interconnections filling the fourth contact holes 51. In FIG. 3B, the reference numeral 52 denotes a portion of the barrier film remaining in each of the fourth contact holes.

As described above, in the present invention, the first plug connected to the source of the cell region is formed simultaneously with the plug connected to the peripheral PMOS source having a sufficient overlay margin. Thus, the problem of overlay on the NMOS gate or NMOS active region of the peripheral region can be eliminated and a sufficient overlay margin can be ensured.

Meanwhile, in the present invention, the metal interconnection connected to the PMOS drain of the peripheral region is formed of the polycrystalline silicon film. Thus, the problems of the encroachment, volcano and agglomeration of tungsten and the formation of a $TiSi_x$ film, which are caused by the existing process using a tungsten metal film, can be solved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming metal interconnections for a flash memory device, which comprises the steps of:

providing a semiconductor substrate having cell and peripheral regions defined therein;

forming gates on the substrate;

forming a source and a drain in the substrate at both sides of each of the gates;

partially etching the gate of the peripheral region to form a first contact hole;

successively forming a silicon nitride film and a first oxide film on the entire surface of the gate including the first contact hole;

selectively etching the first oxide film using the silicon nitride film as an etch stopper, to form a second contact hole exposing the source of the cell region;

forming a first plug filling the second contact hole;

forming a second oxide film on the substrate including the first plug;

selectively etching the second and first oxide films to form third contact holes which expose the drain of the cell region, the source of the peripheral region, end the first contact hole in the gate of the peripheral region, respectively;

forming second plugs filling the third contact holes;

forming a third oxide film on the substrate including the second plugs;

selectively etching the third oxide film to form third contact holes of a dual damascene trench type, which expose the first plug, the second plugs, and a portion of the second oxide film corresponding to the drain of the peripheral region, respectively;

etching the second and first oxide films using the third oxide film as a mask, to form fourth contact holes which expose the first plug, the second plugs and the drain of the peripheral region; and forming metal interconnections filling the fourth contact holes.

2. The method of claim 1, wherein a barrier film is interposed between the fourth contact holes and the metal interconnections.

3. The method of claim 2, wherein the barrier film is formed of a silicon nitride film.

4. The method of claim 1, wherein the gates are PMOS and NMOS gates each having a three-layered structure consisting of a floating gate, a dielectric film and a control gate.

* * * * *